(12) United States Patent  
Sparreboom et al.

(10) Patent No.: US 12,234,143 B2  
(45) Date of Patent: Feb. 25, 2025

(54) MICROELECTROMECHANICAL SYSTEM COMPONENT OR A MICROFLUIDIC COMPONENT COMPRISING A FREE-HANGING OR FREE-STANDING MICROCHANNEL

(71) Applicant: BERKIN B.V., Ruurlo (NL)

(72) Inventors: Wouter Sparreboom, Ruurlo (NL); Jarno Groenesteijn, Ruurlo (NL); Jack Herman Van Putten, Ruurlo (NL); Meint Jelle De Boer, Ruurlo (NL); Remco John Wiegerink, Ruurlo (NL); Henk-Willem Veltkamp, Ruurlo (NL); Qihui Yu, Ruurlo (NL); Mahdieh Yariesbouei, Ruurlo (NL); Miguel A. Rodriguez Olguin, Ruurlo (NL); Joost Conrad Lötters, Ruurlo (NL)

(73) Assignee: BERKIN B.V., Ruurlo (NL)

( * ) Notice: Subject to any disclaimer, the term of this patent is extended or adjusted under 35 U.S.C. 154(b) by 54 days.

(21) Appl. No.: 17/642,362

(22) PCT Filed: Sep. 18, 2020

(86) PCT No.: PCT/NL2020/050578  
§ 371 (c)(1),  
(2) Date: Mar. 11, 2022

(87) PCT Pub. No.: WO2021/054829  
PCT Pub. Date: Mar. 25, 2021

(65) Prior Publication Data  
US 2022/0324701 A1    Oct. 13, 2022

(30) Foreign Application Priority Data  
Sep. 20, 2019   (NL) ..................... 2023872

(51) Int. Cl.  
*B81C 1/00*     (2006.01)  
*G01F 1/84*     (2006.01)  
*G01N 9/32*     (2006.01)

(52) U.S. Cl.  
CPC ........ *B81C 1/00119* (2013.01); *G01F 1/8445* (2013.01); *G01N 9/32* (2013.01);  
(Continued)

(58) Field of Classification Search  
None  
See application file for complete search history.

(56) References Cited

U.S. PATENT DOCUMENTS 5,317,805 A * 6/1994 Hoopman ............... F28F 21/08  
257/E23.098  
6,033,628 A * 3/2000 Kaltenbach ....... B01L 3/502707  
204/600

(Continued)

OTHER PUBLICATIONS

International Search Report & Written Opinion, International Patent Application No. PCT/NL2020/050578, dated Nov. 5, 2020, 13 pages.

(Continued)

*Primary Examiner* — Patrick Assouad  
*Assistant Examiner* — Mark A Shabman  
(74) *Attorney, Agent, or Firm* — Tyler Sisk; Casimir Jones SC; Thomas Lyneis

(57) ABSTRACT

The invention relates to a microelectromechanical system (MEMS) component or microfluidic component comprising a free-hanging or free-standing microchannel (1), as well as methods for manufacturing such a microchannel, as well as a flow sensor, e.g. a thermal flow sensor or a Coriolis flow sensor, pressure sensor or multi-parameter sensor, valve, pump or microheater, comprising such a microelectromechanical system component or microfluidic component. The MEMS component allows to increase the flow range and/or (Continued)

decrease the pressure drop of for instance a micro Coriolis mass flow meter by increasing the channel diameter, while maintaining its advantages.

21 Claims, 9 Drawing Sheets

(52) U.S. Cl.
CPC . *B81B 2201/0214* (2013.01); *B81B 2201/058* (2013.01); *B81B 2203/0338* (2013.01)

(56) References Cited

U.S. PATENT DOCUMENTS

| | | | | |
|---|---|---|---|---|
| 6,093,330 | A * | 7/2000 | Chong | B81C 1/00071 216/2 |
| 6,194,900 | B1 * | 2/2001 | Freeman | G01R 33/302 324/318 |
| 6,534,772 | B1 * | 3/2003 | Chhabra | G01T 1/2921 977/890 |
| 7,333,701 | B1 * | 2/2008 | Feller | G01T 3/00 385/115 |
| 2009/0117287 | A1 | 5/2009 | Hahn et al. | |
| 2010/0193367 | A1 * | 8/2010 | Luch | H05K 3/242 205/129 |
| 2019/0046479 | A1 * | 2/2019 | Pathak | A61M 37/0076 |
| 2019/0374384 | A1 * | 12/2019 | Xie | A61F 2/0063 |

OTHER PUBLICATIONS

Zeng Y et al. "Micro Coriolis MASS flow sensor driven by integrated PZT thin film actuators" 2018 IEEE Micro Electro Mechanical Systems, IEEE, Jan. 21, 2018, pp. 850-853.

May Pw et al. "CVD diamond wires and tubes" Diamond and Related Materials, Elsevier Science Publishers, Amsterdam, NL, vol. 3, No. 4-6, Apr. 1, 1994, pp. 810-813.

Man Leo C T et al. "Influence of a surfactant on single ion track etching: Preparing and manipulationg cylindrical micro wires", Nuclear Instruments & Methods in Physics Research: Section B: Beam Interactions with Materials and Atoms, vol. 265, No. 2, Mar. 1, 1988, pp. 621-625.

Mori T et al "Silica glass tubes by new sol-gel method" Journal of Non-Cystalline Solids, North-Holland Physics Publishing. Amsterdam, NL, vol. 100, No. 1-3, Mar. 1, 1988, pp. 523-525.

Adams, Thomas et al. (2010). Introductory MEMS: Fabrication and Applications. Springer. 10.1007/978-0-387-09511-0, Section 1.2.2.

Elwenspoek, M. C., & Wiegerink, R. J. (2001). Mechanical microsensors. (Microtechnology and MEMS, ISSN 1615-8326). Springer, Section 2.3.

* cited by examiner

MICROELECTROMECHANICAL SYSTEM COMPONENT OR A MICROFLUIDIC COMPONENT COMPRISING A FREE-HANGING OR FREE-STANDING MICROCHANNEL

FIELD OF THE INVENTION

The present invention generally relates to a microelectromechanical system (MEMS) component or microfluidic component comprising a free-hanging or free-standing microchannel, as well as methods for manufacturing a microchannel, as well as a flow sensor, e.g. a thermal sensor or a Coriolis flow sensor, pressure sensor or multi-parameter sensor, comprising such a microelectromechanical system component.

Background of the Invention

From the prior art, a micro Coriolis mass flow meter (MFM) is known for measurement of fluid flows up to 2 or even 4 g/h. These sensors are made using so-called Surface Channel Technology (SCT), which allows for free-hanging, semi-circular channels in a wide range of sizes and shapes.

For instance, in EP 2078936 B1 a method of manufacturing a system chip for a flowmeter is disclosed, wherein a monocrystalline silicon substrate is provided in which a SiN tube is realized by means of SiN deposition steps and partially etching out and partially exposing by etching, such that a tube structure is realized that is fixed on at least one side and is otherwise free, for which micro-SCT is used. The channel width and depth are determined by the slits' location and quantity. The resulted channel cross-section has a shape of a partial circular channel with a flat top. A limited maximum channel diameter of around 300 µm can be achieved by this SCT. In SCT, silicon etching time through the slits and the location of the slits array are crucial to determine surface channel's shape and size.

However, many applications, like liquid chromatography or "Lab-on-a-Chip" use higher flowrates while requiring the low volumes of microfluidic flowmeters, as well as low pressure drop. This cannot be realized by using a microelectromechanical system (MEMS) component manufactured with the SCT process.

OBJECT OF THE INVENTION

It is an object of the invention to provide a microelectromechanical system (MEMS) component or a microfluidic component comprising a free-hanging or free-standing microchannel, as well as methods for manufacturing such a microchannel, wherein higher flowrates can be achieved, while providing the low volumes of microfluidic flowmeters and while providing relatively low pressure drop.

SUMMARY OF THE INVENTION

According to the invention, a microelectromechanical system component or a microfluidic component comprising a free-hanging or free-standing microchannel is provided, characterized in that the channel has a substantially circular cross-section, wherein the diameter of the channel is at least 10 times, such as at least 15 times, such as at least 20 times, such as at least 25 times, such as at least 30 times, such as at least 35 times, such as at least 50 times, such as at least 55 times, such as at least 60 times, such as at least 65 times, such as at least 70 times, such as at least 75 times, such as at least 80 times, such as at least 85 times, such as at least 90 times, such as at least 100 times, the thickness of a channel wall and the diameter of the channel is at least 20 µm. Depending on the lower limit chosen for the above ratio, upper limits for the ratio could be 100, 90, 85, 80, 75, 70, 65, 60, 55, 50, 35, 30, 25, 20, 15, et cetera, depending on the application. Various ranges can thus be defined for the ratio, such as ratios of e.g. 10-100, 15-90, et cetera.

"Free-hanging" or "free-standing" means that, after production, the final channel is not or only minimally connected or attached to the surrounding structure, e.g. a substrate, mould or the like, from which the channel is produced, instead of for instance still being embedded therein. "Substantially circular" indicates a relatively high degree of circularity or rotational symmetry, without for instance a flat top side (like the prior art) or clearly discernible corners (such as with a square shape), although some irregularity is acceptable: this mainly depends on the used technology, the crystal lattice, and irregularities due to fabrication process variations. A hexagonal or similar polygonal shape is thus also conceivable, preferably if the hexagonal or similar polygonal shape has rounded corners.

The above MEMS component or microfluidic component allows to increase the flow range and/or decrease the pressure drop of e.g. the micro Coriolis MFM by increasing the channel diameter, while maintaining its advantages (fast, accurate, low volume, small form factor).

The above MEMS component or microfluidic component has a substantially circular cross-section, lowering sensitivity to pressure when channel diameter increases, as opposed to the SCT process, wherein the channels have a flat top and a maximum channel wall thickness. Both of these limit the maximum size of the free-hanging channel and increase the sensitivity to pressure when the channel size increases.

An embodiment relates to an aforementioned MEMS component or microfluidic component, wherein the diameter of the channel is at least 5 µm, such as at least 10 µm, such as at least 20 µm, such as at least 30 µm, such as at least 40 µm, such as at least 50 µm, such as at least 60 µm, such as at least 70 µm, such as at least 80 µm, such as at least 90 µm, such as at least 100 µm, such as at least 200 µm, such as at least 500 µm, such as at least 1000 µm, to allow for higher flow rates with relatively low pressure drop. Upper limits for the channel diameter could be 10 µm, 20 µm, 30 µm, 40 µm, 50 µm, 60 µm, 70 µm, 80 µm, 90 µm, 100 µm, 200 µm, 500 µm, 1000 µm, et cetera, depending on the application. Various channel diameter ranges can thus be defined, such as channel diameters of e.g. 5-1000 µm, 10-500 µm, et cetera.

An embodiment relates to an aforementioned MEMS component or microfluidic component, wherein the thickness of the channel wall is smaller than 50 µm, or 20 µm, or 10 µm, such as smaller than 5 µm, such as smaller than 2.5 µm, such as smaller than 2 µm, such as smaller than 1.5 µm, such as smaller than 1.4 µm, such as smaller than 1.3 µm, such as smaller than 1.2 µm, such as smaller than 1.1 µm, such as smaller than 1.0 µm. Depending on the chosen upper limit for the wall thickness, lower limits for the channel diameter could be 5 µm, 2.5 µm, 2 µm, 1.5 µm, 1.4 µm, 1.3 µm, 1.2 µm, 1.1 µm, 1.0 µm, et cetera, depending on the application. Various wall thickness ranges can thus be defined, such as wall thicknesses of e.g. 1.0-10 µm, 1.2-5 µm, et cetera.

Another aspect of the invention concerns a flow sensor, e.g. a thermal sensor or a Coriolis flow sensor, or a pressure sensor, a density sensor, a viscosity sensor, or a multi-parameter sensor, or a (micro) valve, or a (micro) pump, or a microheater, or a microcooler or a lab-on-a-chip e.g. a biosensor or a chemosensor comprising an aforementioned microelectromechanical system component or microfluidic component.

A further aspect of the invention concerns a microfluidic component or a MEMS component which is pre-shaped. Thus, the channel is manufactured to have the final shape, without an additional bending step.

First Method

Another aspect of the invention concerns a first method of manufacturing a free-hanging microchannel, in particular for use in an aforementioned microelectromechanical system component or microfluidic component, comprising the steps of:
(a) providing a substrate of a first material;
(b) depositing a trench-etch protective layer on a front side and/or a back side of the substrate;
(c) etching a trench in the first material through the trench-etch protective layer;
(d) creating a channel-etch protective layer in the trench, covering a bottom wall and side walls of the trench;
(e) etching the first material of the substrate through the channel-etch protective layer and the bottom wall of the trench to form a channel outline centering around the location of the etched-away bottom wall of the trench;
(f) removing the trench-etch and channel-etch protective layers from the substrate;
(g) depositing a wall-forming layer on the substrate, wherein the wall-forming layer forms a channel wall on the channel outline and closes the trench;
(h) etching the substrate to remove the first material surrounding the channel wall, such that the channel becomes free-hanging.

The method presented above implements some important changes to the SCT. By (isotropically) etching the channel from the bottom of a trench instead of at the surface of the wafer, the flat top inherent to SCT can be avoided.

The channels can have a diameter of e.g. up to 180 μm with a channel wall thickness up to 10 μm. Integrated metal electrodes can be used for actuation and read-out of a microfluidic sensor. Thus, for instance a high-flow micro Coriolis mass flow sensor can be realized.

An embodiment relates to an aforementioned method, further comprising:
(i) creating an inlet-etch protective layer on a front side and/or a back side of the substrate, preferably after step (a) and before step (b).

Thus, a protective layer can be formed before etching an inlet for the channel in the substrate.

An embodiment thus relates to an aforementioned method, further comprising:
(j) etching an inlet in the substrate at the front side and/or back side of the substrate, through the inlet-etch protective layer, preferably after step (a) and (i) and before step (b),
(k) depositing the wall-forming layer on the substrate during step (g), wherein the wall-forming layer covers an inlet side wall, forms the channel wall on the channel outline and closes the trench, wherein the inlet and the channel form a continuous flow channel.

An embodiment relates to an aforementioned method, further comprising:
(l) depositing a photoresist layer on top of the inlet-etch protective layer and/or trench-etch protective layer and/or metal layer.

An embodiment relates to an aforementioned method, further comprising:
(m) removing the inlet-etch protective layer from the front side and/or back side of the substrate, preferably before step (b).

An embodiment relates to an aforementioned method, further comprising:
(n) depositing a further trench-etch protective layer on the trench-etch protective layer, preferably after step (b) and before step (c);

An embodiment relates to an aforementioned method, further comprising:
(o) depositing a metal layer on top of the wall-forming layer above the channel, before (h) etching the substrate to remove the first material surrounding the channel wall.

That is, after the channel is "closed", the abovementioned metal layer is deposited and patterned to form e.g. electrodes for actuation and read-out of a Coriolis sensor.

An embodiment relates to an aforementioned method, wherein the metal layer comprises a gold layer with a chromium adhesion layer.

An embodiment relates to an aforementioned method, wherein the first material is silicon. The silicon preferably comprises highly doped silicon and/or the silicon wafer is a highly doped silicon wafer.

An embodiment thus relates to an aforementioned method, wherein the substrate is a silicon wafer.

An embodiment relates to an aforementioned method, wherein the silicon wafer has a thickness of 200-2000 μm, preferably 400-600 μm, more preferably 500-550 μm, such as 525 μm.

An embodiment relates to an aforementioned method, wherein the inlet-etch protective layer comprises thermal $SiO_2$. The inlet-etch protective layer with thermal $SiO_2$ (t-$SiO_2$) may be used as a hard-mask during the inlet etch, such as from the backside of the wafer, as discussed hereafter.

An embodiment relates to an aforementioned method, wherein the trench-etch protective layer is deposited using low pressure chemical vapour deposition (LPCVD). The trench-etch oxide layer may be patterned with one or more rectangular trenches of e.g. 5-20 μm wide, such as 10 μm wide and 25-75 μm long, such as 50 μm long, which form the outline of the channels, as discussed hereafter.

An embodiment relates to an aforementioned method, wherein the further trench-etch protective layer is deposited using tetraethyl orthosilicate (TEOS, $Si(OC_2H_5)_4$).

An embodiment relates to an aforementioned method, wherein the trench-etch protective layer is used as a hard-mask to etch the trench. The trench-etch protective layer may e.g. be used as a hard-mask to etch one or more trenches of 100-150 μm, such as 110 μm deep. The trench-etch protective layer is preferably also deposited inside the inlet(s)—if present—to protect them during the channel etch.

An embodiment relates to an aforementioned method, wherein the channel-etch protective layer comprises thermal $SiO_2$. This layer will protect the trench side walls during the channel etch.

An embodiment relates to an aforementioned method, wherein the trench-etch protective layer is deposited using plasma enhanced chemical vapour deposition (PECVD). The PECVD process preferably is not conformal, which means that virtually no $SiO_2$ will be deposited inside the trench(es), while a very thick layer is deposited on the surface of the wafer.

An embodiment relates to an aforementioned method, wherein etching the substrate through the bottom wall of the trench to form a channel outline comprises using a directional plasma etch to remove the channel-etch protective layer. Since the etch rate of this process decreases heavily inside the trench(es), the trench-etch protective layer (PECVD layer) at the surface needs to be much thicker than the thermal $SiO_2$ layer at the bottom of the trench.

An embodiment relates to an aforementioned method, wherein etching the substrate through the bottom wall of the trench to form a channel outline comprises using isotropic gas-phase $XeF_2$ to remove the first material. This etch process is essentially isotropic, thus resulting in a round channel centering around the bottom of the etch trenches. However, the use of other gases is also conceivable. Even fluids can be used, such as HNA (a mixture of 69% $HNO_3$, 50% HF and $H_2O$ at a ratio of 2:1:2).

An embodiment relates to an aforementioned method, wherein removing any one of the protective layers from the substrate comprises using a wet HF etch e.g. in order to prepare for depositing the wall-forming layer, as discussed below.

An embodiment relates to an aforementioned method, wherein depositing the wall-forming layer on the substrate comprises the steps of:
  depositing a first wall-forming layer comprising thermal $SiO_2$;
  depositing a second wall-forming layer using low pressure chemical vapour deposition (LPCVD) comprising silicon-rich silicon nitride (SiRN);
  depositing a third wall-forming layer comprising polycrystalline silicon (polySi); and
  depositing a fourth wall-forming layer comprising silicon-rich silicon nitride (SiRN).

The thickness of the total "stack" can be up to 10 μm (depending on the etch trench width) and may be conformally deposited, meaning it is deposited inside the channels and on the front side and back side of the substrate or wafer. The wall-forming layer closes the trench(es) through which the channel is etched, resulting in an enclosed, leak-free channel. The only wetted material inside the channels is silicon-rich silicon nitride (SiRN).

An embodiment relates to an aforementioned method, comprising creating one or more holes or recesses in the trench, preferably after depositing the third wall-forming layer and before depositing the fourth wall-forming layer, to prevent the trench from being blocked by the first, second, third and/or fourth wall-forming layers.

An embodiment relates to an aforementioned method, wherein etching the substrate to remove the first material surrounding the channel wall comprises etching the wall-forming layer on the front side and/or back side of the substrate to reach the first material, e.g. the layer-stack on top of the wafer is etched to reach the bulk substrate, e.g. silicon, next to the channel.

An embodiment relates to an aforementioned method, wherein etching the wall-forming layer on the front side of the substrate to reach the first material comprises using a directional plasma etch.

An embodiment relates to an aforementioned method, wherein etching the substrate to remove the first material surrounding the channel wall, such that the channel becomes free-hanging, comprises removing the first material with a semi-isotropic SF6 plasma etch and an isotropic gas phase XeF2 etch. However, as stated before, the use of other gases is also conceivable. Even fluids can be used, such as HNA, as explained hereafter.

An embodiment relates to a MEMS component or microfluidic component manufactured by any of the aforementioned methods.

Further embodiments of the invention will be discussed below:

An embodiment relates to an aforementioned method of manufacturing a free-hanging microchannel, in particular for use in a microelectromechanical system component as described above, comprising the steps of: (a) providing a substrate of a first material; (b) depositing a trench-etch protective layer on a front side and/or a back side of the substrate; (c) etching a trench in the first material through the trench-etch protective layer; (d) creating a channel-etch protective layer in the trench, covering a bottom wall and side walls of the trench; (e) etching the first material of the substrate through the channel-etch protective layer and the bottom wall of the trench to form a channel outline centering around the location of the etched-away bottom wall of the trench; (f) removing the trench-etch and channel-etch protective layers from the substrate; (g) depositing a wall-forming layer on the substrate, wherein the wall-forming layer forms a channel wall on the channel outline and closes the trench; (h) etching the substrate to remove the first material surrounding the channel wall, such that the channel becomes free-hanging.

An embodiment relates to an aforementioned method, further comprising: (i) creating an inlet-etch protective layer on a front side and/or a back side of the substrate, preferably after step (a) and before step (b).

An embodiment relates to an aforementioned method, further comprising: (j) etching an inlet in the substrate at the front side and/or back side of the substrate, through the inlet-etch protective layer, preferably after step (a) and (i) and before step (b); (k) depositing the wall-forming layer on the substrate during step (g), wherein the wall-forming layer covers an inlet side wall, forms the channel wall on the channel outline and closes the trench, wherein the inlet and the channel form a continuous flow channel.

An embodiment relates to an aforementioned method, further comprising: (l) depositing a photoresist layer on top of the inlet-etch protective layer and/or trench-etch protective layer and/or metal layer.

An embodiment relates to an aforementioned method, further comprising: (m) removing the inlet-etch protective layer from the front side and/or back side of the substrate, preferably before step (b).

An embodiment relates to an aforementioned method, further comprising: (n) depositing a further trench-etch protective layer on the trench-etch protective layer, preferably after step (b) and before step (c).

An embodiment relates to an aforementioned method, further comprising: (o) depositing a metal layer on top of the wall-forming layer above the channel, before (h) etching the substrate to remove the first material surrounding the channel wall.

An embodiment relates to an aforementioned method, wherein the metal layer comprises a gold layer with a chromium adhesion layer.

An embodiment relates to an aforementioned method, wherein the first material is silicon.

An embodiment relates to an aforementioned method, wherein the substrate is a silicon wafer.

An embodiment relates to an aforementioned method, wherein the silicon wafer has a thickness of 200-2000 μm, preferably 400-600 μm, more preferably 500-550 μm, such as 525 μm.

An embodiment relates to an aforementioned method, wherein the inlet-etch protective layer comprises thermal $SiO_2$.

An embodiment relates to an aforementioned method, wherein the trench-etch protective layer is deposited using low pressure chemical vapour deposition (LPCVD).

An embodiment relates to an aforementioned method, wherein the further trench-etch protective layer is deposited using tetraethyl orthosilicate (TEOS, $Si(OC_2H_5)_4$).

An embodiment relates to an aforementioned method, wherein the trench-etch protective layer is used as a hard-mask to etch the trench.

An embodiment relates to an aforementioned method, wherein the channel-etch protective layer comprises thermal $SiO_2$.

An embodiment relates to an aforementioned method, wherein the trench-etch protective layer is deposited using plasma enhanced chemical vapour deposition (PECVD).

An embodiment relates to an aforementioned method, wherein etching the substrate through the bottom wall of the trench to form a channel outline comprises using a directional plasma etch to remove the channel-etch protective layer.

An embodiment relates to an aforementioned method, wherein etching the substrate through the bottom wall of the trench to form a channel outline comprises using isotropic gas-phase $XeF_2$ to remove the first material.

An embodiment relates to an aforementioned method, wherein removing any one of the protective layers from the substrate comprises using a wet HF etch.

An embodiment relates to an aforementioned method, wherein depositing the wall-forming layer on the substrate comprises the steps of:
 depositing a first wall-forming layer comprising thermal $SiO_2$;
 depositing a second wall-forming layer using low pressure chemical vapour deposition (LPCVD) comprising silicon-rich silicon nitride (SiRN);
 depositing a third wall-forming layer comprising polycrystalline silicon (polySi); and
 depositing a fourth wall-forming layer comprising silicon-rich silicon nitride (SiRN).

An embodiment relates to an aforementioned method, comprising creating one or more holes or recesses in the trench, preferably after depositing the third wall-forming layer and before depositing the fourth wall-forming layer, to prevent the trench from being blocked by the first, second, third and/or fourth wall-forming layers.

An embodiment relates to an aforementioned method, wherein etching the substrate to remove the first material surrounding the channel wall comprises etching the wall-forming layer on the front side and/or back side of the substrate to reach the first material.

An embodiment relates to an aforementioned method, wherein etching the wall-forming layer on the front side of the substrate to reach the first material comprises using a directional plasma etch.

An embodiment relates to an aforementioned method, wherein etching the substrate to remove the first material surrounding the channel wall, such that the channel becomes free-hanging, comprises removing the first material with a semi-isotropic $SF_6$ plasma etch and an isotropic gas phase $XeF_2$ etch.

Second Method

Another aspect of the invention concerns a second method of manufacturing a free-hanging or free-standing microchannel, in particular for use in an aforementioned microelectromechanical system component, using a sol-gel method comprising the steps of:
 forming a mold with a circular channel;
 flushing the circular channel with a flushing fluid to create an oxidized inner channel wall;
 cleaning and drying the oxidized inner channel wall;
 flushing the circular channel with a sol-gel solution;
 initiating a gelation reaction until a desired channel wall thickness is achieved;
 flushing out the remaining sol-gel solution; and
 removing the mold material from around the channel wall.

The above method allows for manufacturing a free-hanging or free-standing microchannel, with reduced pressure sensitivity and increased flow range, wherein the channel cross-section is more circular. Furthermore, the channel diameter can be increased up to e.g. 1000 μm.

An embodiment relates to an aforementioned method, wherein the mold material comprises polydimethylsiloxane (PDMS). The mold itself may be formed by using the ESCARGOT (Embedded SCAffold RemovinG Open Technology) method.

An embodiment relates to an aforementioned method, wherein the flushing fluid comprises a Piranha solution.

An embodiment relates to an aforementioned method, wherein the circular channel is flushed with the flushing fluid for 35-70 s.

Thus, hydroxyl groups are encouraged to form covalent bonds.

An embodiment relates to an aforementioned method, wherein cleaning and drying the oxidized inner channel wall is carried out using deionized (DI) water and nitrogen.

An embodiment relates to an aforementioned method, wherein the sol-gel solution is created by mixing TEOS, MTES (methyltriethoxysilane), ethanol and water, preferably in a 1:1:1:1 ratio, more preferably comprising adding HCl to adjust the pH to 4.

Preferably, the sol-gel mixture is slowly flushed through the circular channel using a syringe pump. To initiate the gelation reaction, the channel may e.g. be placed on a hot plate at 55° C. This temperature may be limited by two factors: ethanol evaporation that leads to a non-uniform channel and, in case PDMS is used as the material for the mold, the glass transition temperature of PDMS.

To flush out the remaining sol-gel solution, air flow may be used.

The inventors have found that the thickness of the channel wall can be controlled by the time and temperature of the gelation reaction, and e.g. the pumping rate of the syringe pump. However, it should be noted that, when PDMS is used, PDMS does not dissolve in Piranha solution easily and also part of the channel wall may be dissolved.

An embodiment relates to a MEMS component manufactured by any of the aforementioned methods.

Further embodiments of the invention will be discussed below:

An embodiment relates to an aforementioned method of manufacturing a free-hanging or free-standing microchannel, in particular for use in a microelectromechanical system component or microfluidic component as described above, using a sol-gel method comprising the steps of:
 forming a mould with a circular channel;
 flushing the circular channel with a flushing fluid to create an oxidized inner channel wall;
 cleaning and drying the oxidized inner channel wall;
 flushing the circular channel with a sol-gel solution;

initiating a gelation reaction until a desired channel wall thickness is achieved;

flushing out the remaining sol-gel solution; and removing the mould material from around the channel wall.

An embodiment relates to an aforementioned method, wherein the mould material comprises polydimethylsiloxane (PDMS).

An embodiment relates to an aforementioned method, wherein the flushing fluid comprises a Piranha solution.

An embodiment relates to an aforementioned method, wherein the circular channel is flushed with the flushing fluid for 35-70 s.

An embodiment relates to an aforementioned method, wherein cleaning and drying the oxidized inner channel wall is carried out using deionized (DI) water and nitrogen.

An embodiment relates to an aforementioned method, wherein the sol-gel solution is created by mixing TEOS, MTES, ethanol and water, preferably in a 1:1:1:1 ratio, more preferably comprising adding HCl to adjust the pH to 4.

Third Method

Another aspect of the invention concerns a third method of manufacturing a free-hanging or free-standing microchannel, in particular for use in a microfluidic component, such as in an aforementioned microelectromechanical system component, using an electroplating method, comprising the steps of:

providing a conductive or non-conductive electroplating wire;

when the electroplating wire is non-conductive: forming a conductive coating on the electroplating wire to form a cathode;

electroplating a channel wall on the electroplating wire or the conductive coating; and removing the electroplating wire.

An embodiment relates to an aforementioned method, wherein the electroplating wire is made of acrylonitrile-butadiene-styrene (ABS) or copper. The ABS can be dissolved afterwards by for instance using acetone. Other materials that can be dissolved, etched-away or otherwise removed can also be used. The material can also be conductive, such that no additional conductive coating needs to be applied (see here below).

An embodiment relates to an aforementioned method, wherein the conductive coating comprises silver. To produce an electrically conductive cathode the e.g. ABS electroplating wire may be coated by silver conductive paint and dried at room temperature. No additional conductive coating needs to be applied when the wire material itself is already conductive. It is preferred that the conductive coating can be easily removed when forming the free-standing channel. Nickel conductive paint, and other conductive metal paints, can be alternatives for silver conductive paint.

An embodiment relates to an electroplating cell having two electrodes immersed in an electrolyte bath, and a direct current power supply. The anode is a bar of the metal which is to form the channel (preferably nickel, such as a 99.99% pure bar of nickel, or copper or another metal), whereas the conductive or coated non-conductive electroplating wire forms the cathode.

An embodiment relates to an aforementioned method, wherein the channel wall comprises nickel or copper and the electroplating step is carried out in a nickel or copper electroplating cell using an aqueous nickel or copper solution. The copper electroplating cell therein may e.g. comprise a copper anode, the e.g. ABS wire as cathode, an aqueous copper solution and a DC power supply, for sake of completeness. A volume of 1 liter aqueous copper solution may for instance be used containing 0.1 kg copper salt, 0.11 liter 96% sulphuric acid, 0.15 ml 50% HCl, 10 ml HL11 starter and 0.25 ml HL13 grain refiner. Deionized (DI) water may be added to reach the required volume. Other metals than nickel or copper can in principle also be used. The electrolyte solution can be optimized for each metal to maximize production efficiency.

Nickel is particularly preferred as a component of the channel wall. Nickel has excellent corrosion resistance to aqueous solutions (pH between 4 and 10), as well as for common alcohols and simple carbohydrates. In some applications, it may be advantageous to leave a (partial) coating of the silver paint to take advantage of the properties of silver. The invention also contemplates other coatings, on the inside of the channel as well as the outside, to protect the channel wall from adverse environmental impact from the outside and from corrosive fluids on the inside.

Another embodiment relates to a channel produced by an aforementioned method that is (nearly) perfectly circular, rather than substantially circular.

An embodiment relates to an aforementioned method, wherein the microchannel is incorporated in a microfluidic system component or a microelectromechanical system (MEMS) component. The microfluidic component may be a flow sensor; a pressure sensor; a density sensor; a viscosity sensor; a multi-parameter sensor; valve; pump; and/or a microheater. The flow sensor is preferably a thermal flow sensor or a Coriolis flow sensor.

An embodiment relates to an aforementioned method, wherein the electroplating wire is pre-shaped, so as to manufacture a free-standing microchannel in that shape without bending the microchannel. Thus, the electroplating wire may have one or more bends. The bends may be in one plane. Preferably, the bends are rounded. The shape may be optimized to facilitate the step of removing the electroplating wire. In a particularly preferred embodiment, the shape is a U-shape or a loop for a Coriolis flow meter as disclosed in EP 1719982 B1. Preferably, the pre-shaped electroplating wire is attached to a MEMS system or a microfluidic system before the step of electroplating.

Another preferred embodiment relates to a microfluidic density sensor, which comprises a plated free-hanging or free-standing microchannel; actuating means for vibrating the free-standing microfluidic component at its resonance frequency; and readout means for measuring and comparing the resonance frequency. The shape of the microchannel is straight, rectangular, triangular or U-shaped (Groenesteijn, J.; van de Ridder, B.; Lötters, J. C.; Wiegerink, R. J./Modelling of a micro Coriolis mass flow sensor for sensitivity improvement. Paper presented at 2014 IEEE Sensors, Valencia, Spain.). An U-shaped microchannel with a straight middle part is particularly preferred, which could, for example, be used in combination with the actuation shown in FIG. 5 of Groenesteijn, J, et al., 2012, A: Physical, vol. 186, pp. 48-53; DOI: 10.1016/j.sna.2012.01.010. The density sensor is a microfluidic device. Actuation means preferably use Lorentz force, and readout means are preferably capacitive, as is known to the skilled person. The readout means are sensitive to any change in resonance due to a change in weight and thus density of the medium.

A further embodiment relates to an aforementioned method, wherein the electroplating wire is pre-shaped and attached to a microfluidic system, optionally a MEMS system before electroplating. The wire and the attachment points are then electroplated, resulting in a directly formed connection of the channel to the device, without other attachment means such as welding, soldering or gluing.

The electroplating may be done at room temperature with a current density of for instance 3 A/dm² for 1 h. After electroplating, the substrate may be rinsed with DI water to prevent oxidation of the electroplated material, e.g. copper. The electroplating wire may be immersed in a beaker of acetone for 12 hours to completely etch the ABS wire inside (when ABS is used). Instead of ABS, polyamide (PA) polymer could also be used which can be dissolved in hot water.

BRIEF DESCRIPTION OF THE DRAWINGS

The invention will next be explained by means of the accompanying drawings and description of the figures.

In FIGS. 1a-2g different stages of manufacturing a free-hanging microchannel according to the first method are shown, wherein FIGS. 1a-1g show the different stages using a cross-section of the substrate along the length of the channel and FIGS. 2a-2g show the stages using a cross-section of the substrate perpendicular to the channel:

FIGS. 1a and 2a schematically show the creation of a first thermal SiO₂ layer as an inlet-etch protective layer, and the etching of an inlet;

FIGS. 1b and 2b schematically show the creation of an LPCVD SiO₂ layer as a trench-etch protective layer and the etching of three trenches;

FIGS. 1c and 2c schematically show the creation of a PECVD SiO₂ layer as a further trench-etch protective layer in the three trenches, and the creation of a second thermal SiO₂ layer as a channel-etch protective layer;

FIGS. 1d and 2d schematically show the etching of the substrate through the bottom walls of the three trenches to form a channel outline;

FIGS. 1e and 2e schematically show the deposition of a wall-forming layer on the substrate;

FIGS. 1f and 2f schematically show the deposition of a metal layer on top of the wall-forming layer above a channel;

FIGS. 1g and 2g schematically show etching the substrate to remove the first material surrounding the channel walls, such that the channels become free-hanging.

FIG. 6a schematically shows an example of a mould with a circular channel;

FIG. 6b schematically shows flushing the circular channel with Piranha solution;

FIG. 6c schematically shows the formation of hydroxyl groups on the channel inner wall;

FIG. 6d schematically shows flushing the circular channel with a sol-gel solution;

FIG. 6e schematically shows the creation of a silicon dioxide layer on the inner circular wall; and FIG. 6f schematically shows the resulting free-standing channel.

FIG. 7a schematically shows an electroplating wire;

FIG. 7b schematically shows a conductive layer being applied to the electroplating wire to form a cathode;

FIG. 7c schematically shows a copper or nickel layer being applied onto the conductive layer; and FIG. 7d schematically shows a free-standing (copper or nickel) channel.

DETAILED DESCRIPTION

First Method

Figure 1A:
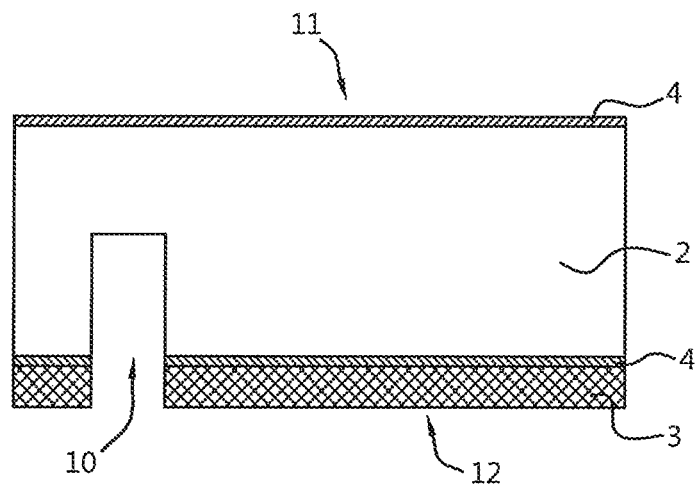

As will be shown with respect to FIGS. 1a-5, and as discussed in the foregoing, the Applicant has come up with a first advantageous fabrication process to fabricate relatively large, free-hanging of free-standing microchannels 1, preferably integrated with electrodes 23 for actuation and read-out of a micro Coriolis mass flow sensor. The process improves on the previously presented SCT. The resulting microchannels 1 have a circular or near-circular (such as partially hexagonal) cross-section with a diameter of for instance up to 180 µm and a channel-wall 7 thickness for instance up to 10 µm without the use of wafer bonding. The channels 1 can be released from the bulk to allow the vibrational movement needed for a Coriolis mass flow meter (MFM). Integrated metal electrodes 23 can be used for actuation and read-out of the sensor.

However, as discussed in the foregoing, many applications, like liquid chromatography or "Lab-on-a-Chip" use higher flowrates while requiring the low volumes of microfluidic flowmeters. To be able to increase the flow-range and/or decrease the pressure drop of the micro Coriolis MFM the channel-diameter needs to be increased, while maintaining its advantages (fast, accurate, low volume, small form factor). However, inherent to the SCT process, the channels have a flat top and a maximum channel-wall thickness. Both of these limit the maximum size of the free-hanging channel and increase the sensitivity to pressure when the channel size increases.

The fabrication process shown in FIGS. 1a-5 implements two main changes to the SCT. By isotropically etching the channel 1 from the bottom 16 of a trench 15 instead of at the surface of the wafer 2, the "flat top" inherent to SCT can be avoided. Furthermore, by preferably using a stack of multiple materials as the channel wall 7, the wall-thickness can be increased beyond what the intrinsic stress of the silicon-rich silicon nitride (SiRN) used in SCT allows.

Fabrication Outline

In FIGS. 1a-5 a short overview of the first fabrication process is shown.

Figure 2A:
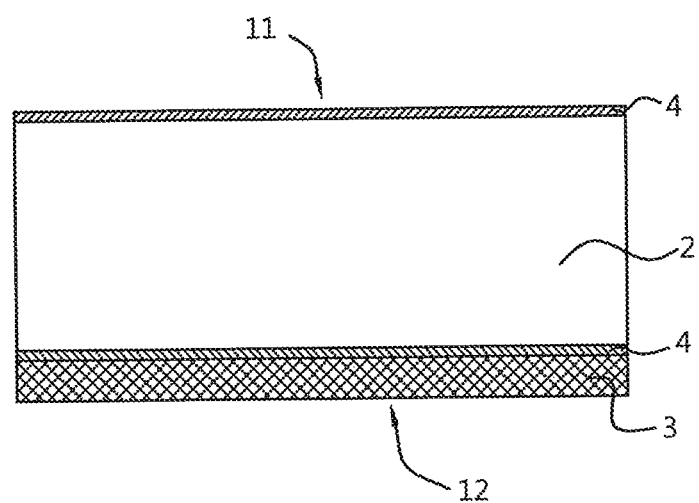

As shown in FIGS. 1a and 2a, the fabrication preferably may start with wet thermal oxidation of a e.g. 525 µm thick, highly doped silicon wafer 2 as the substrate 2. This thermal SiO₂ (t-SiO₂) layer 4 functions as an inlet-etch protective layer 4 and may be used as a hard-mask during the inlet 10 etch from the back side 12 of the wafer 2.

Figure 1B:
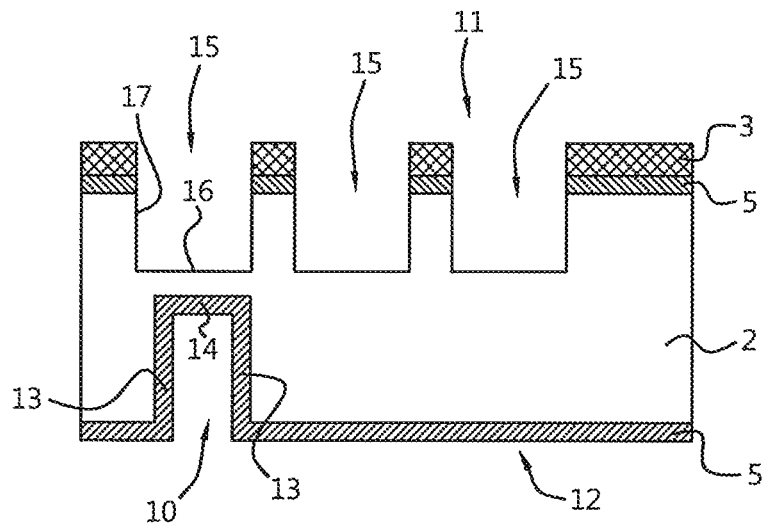
Figure 2B:
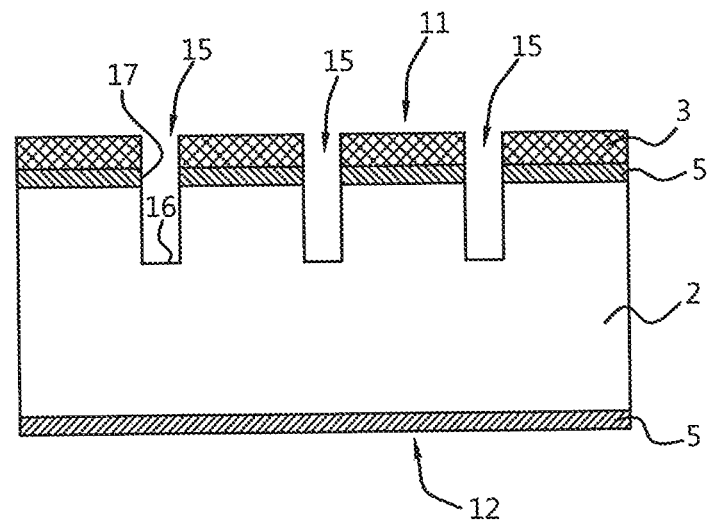

As shown in FIGS. 1b and 2b, after the inlet-etch, the inlet-etch protective layer 4 may be stripped and a new SiO₂ layer 5 (as the trench-etch protective layer 5) is deposited using low pressure chemical vapour deposition (LPCVD) of tetraethyl orthosilicate (TEOS, Si(OC₂H₅)₄). This trench-etch protective layer 5 is patterned with rectangular holes, such as three rectangular holes, of for instance 10 µm wide and 50 µm long which may form a longitudinal outline of the channels 1. The SiO₂ layer 5 is then used as a hard-mask to etch the trenches 15 of for instance 110 µm deep through which the channels 1 will be etched.

Figure 1C:
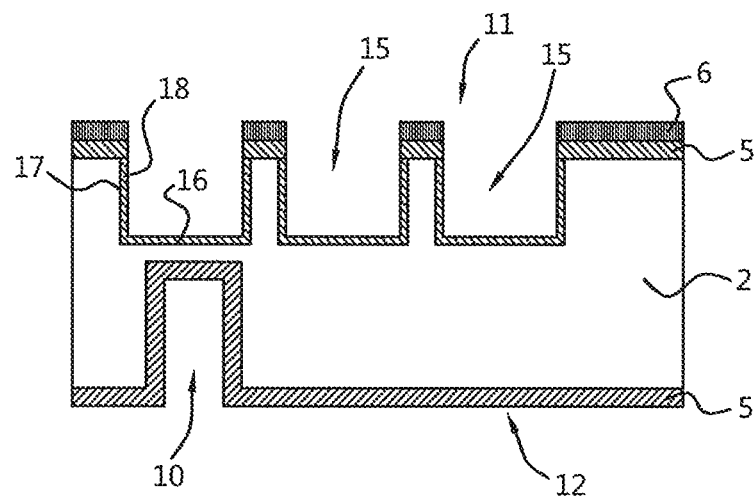
Figure 2C:
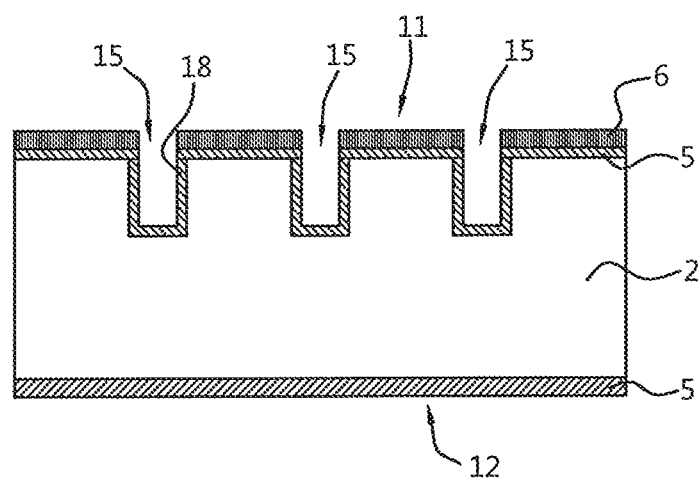

As shown in FIGS. 1c and 2c, this $SiO_2$ layer 5 may also be deposited inside the inlet 10 to protect the inlet 10 during the channel etch. Next, a thermal oxidation step may be carried out, which forms a protective t-$SiO_2$ layer 18 as the channel-etch protective layer 18 on the silicon in the trench 15. This channel-etch protective layer 18 will protect the trench side-walls 17 during the channel etch. Using e.g. plasma enhanced chemical vapour deposition (PECVD), a thick $SiO_2$ layer 6 as a further trench-etch protective layer 6 may be deposited on the front side 11 of the wafer 2.

The PECVD process is preferably not conformal, which means that virtually no $SiO_2$ will be deposited inside the trenches 15, while a relatively thick layer is deposited on the surface of the wafer 2. A directional plasma etch may be used to remove the t-$SiO_2$ at the bottom 16 of the trenches 15. Since the etch-rate of this process decreases heavily inside the trenches 15, the PECVD $SiO_2$ layer 6 at the surface (front side 11) needs to be much thicker than the t-$SiO_2$ layer at the bottom 16.

Figure 1D:
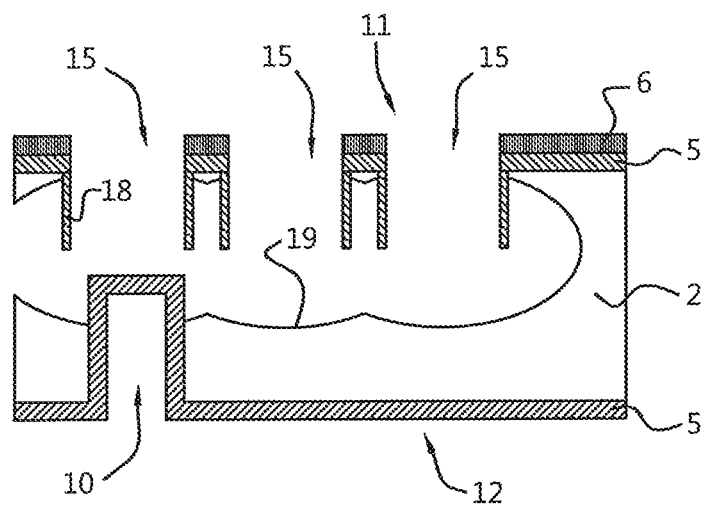
Figure 2D:
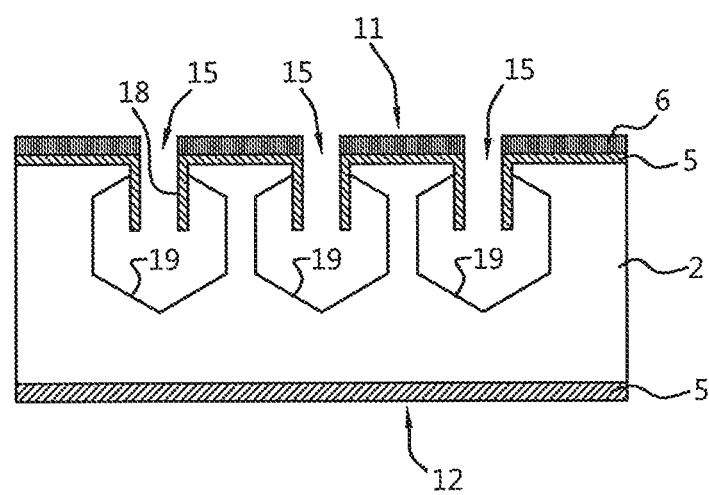

As shown in FIGS. 1d and 2d, the channels 1 may then be etched in the bulk of the wafer 2, through the trenches 15, by, for instance, an isotropic gas-phase XeF2 etch. The etch process is generally isotropic, so it results in a round channel 1 centering around the location of the etched-away bottom wall 16 of the etch-trenches 15.

Figure 1E:
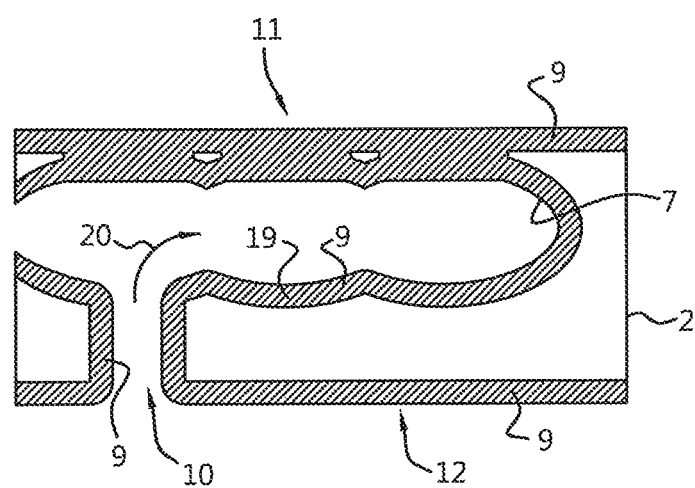
Figure 2E:
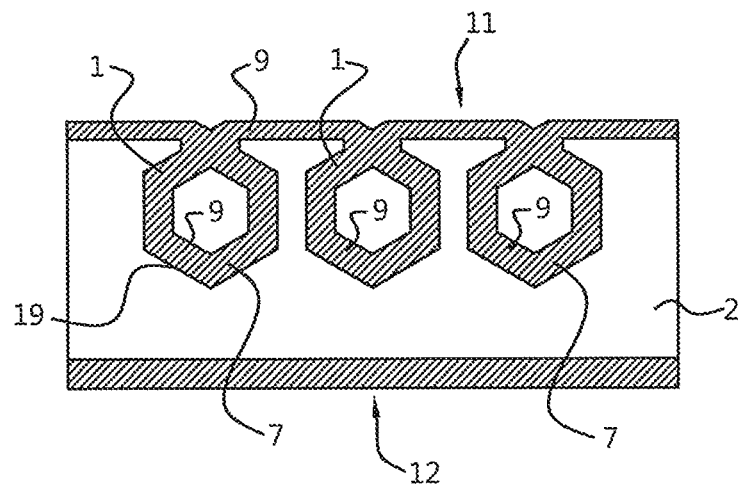

As shown in FIGS. 1e and 2e, all $SiO_2$ may be removed using a wet HF etch and the channel wall 7 may be deposited. The first layer preferably is a t-$SiO_2$ layer, followed by LPCVD of silicon-rich silicon nitride (SiRN) layer, a polycrystalline silicon (polySi) layer and a final SiRN layer (as more clearly shown in FIG. 3).

Figure 1F:
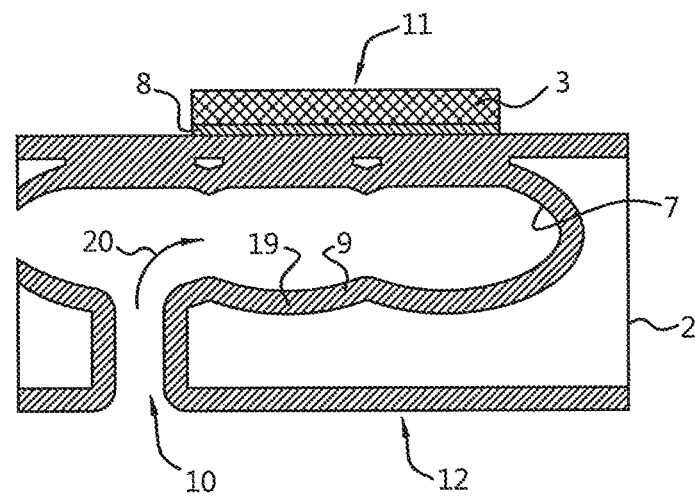
Figure 2F:
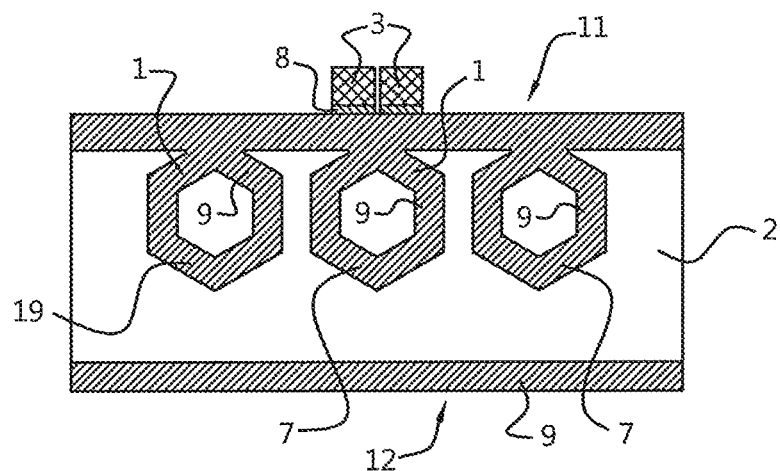

As shown in FIGS. 1f and 2f, the thickness of the total stack can be e.g. up to 10 μm (depending on the etch-trench width) and may be conformally deposited, meaning it is deposited inside the channel outlines 19 and on the front side 11 and back side 12 of the wafer 2. It may close the trenches 15 through which the channel 1 is etched, resulting in an enclosed, leak-free channel 1. The only wetted material inside the channels 1 is silicon-rich silicon nitride (SiRN). After the channel 1 is closed, a gold layer 8 with chromium adhesion layer may be deposited and patterned to form the electrodes for actuation and read-out of e.g. a Coriolis sensor.

Figure 1G:
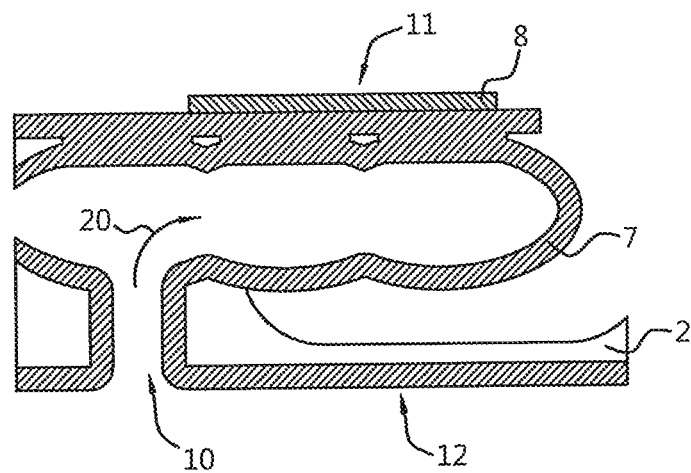
Figure 2G:
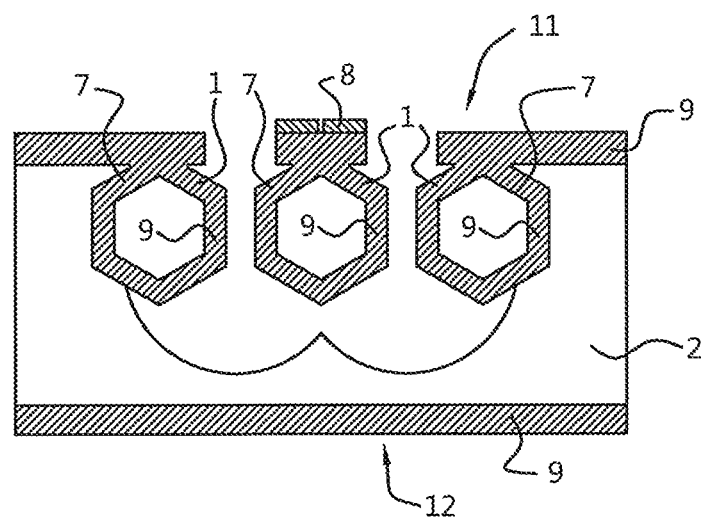

As shown in FIGS. 1g and 2g, finally, the layer-stack on top of the wafer 2 may be etched using a directional plasma etch to reach the bulk silicon next to the channel 1. Using a semi-isotropic $SF_6$ plasma etch and an isotropic gas-phase $XeF_2$ etch, the silicon around the channels 1 may be removed to allow for free movement of the channels 1.

Fabrication Results

At the start of the etch, the silicon loading is very small and plenty of etchant can reach the silicon, while the reaction products can be removed. This results in a completely isotropic etch. However, when the channel diameter increases, the silicon load also increases while the trenches 15 through which the etchant and reaction products have to diffuse does not increase. As a result, the $XeF_2$ concentration inside the channels will decrease, changing the etch kinetics, eventually resulting in a less desirable hexagonal cross-section.

Channel Wall

Previously, the channel wall 7 was made using a single silicon-rich silicon nitride layer (SiRN). Due to intrinsic stress in the layer available, the layer can only be 2 μm thick. This means that, when the channel 1 diameter increases, the strength and stiffness of the channel wall 7 may not increase with it. As a result, the mechanical behaviour of the free-hanging channel 1 will increasingly depend on external influences like applied pressure and temperature. To create free-hanging channels 1 with a thicker channel wall 7, preferably a layer stack is used where every layer has a function: The $SiO_2$ protects the channel wall 7 during the $XeF_2$ release etch.

$SiO_2$ has a much better selectivity compared to SiRN which allows to release the complete channel 1.

The SiRN at the inside of the channel wall 7 results in a chemically inert fluid path. Due to intrinsic stress, the maximum thickness of these SiRN layers is approximately 2 μm and can thus not be used for the whole channel wall 7. It is also deposited at the outside of the channel wall 7 to make sure the stress in the channel wall 7 is mostly balanced.

The polySi can be deposited e.g. up to 10 μm while its stress can be tuned by annealing. As a result, this layer can be used to reach a specific wall thickness without influencing the stress inside the channel wall 7.

Figure 3:
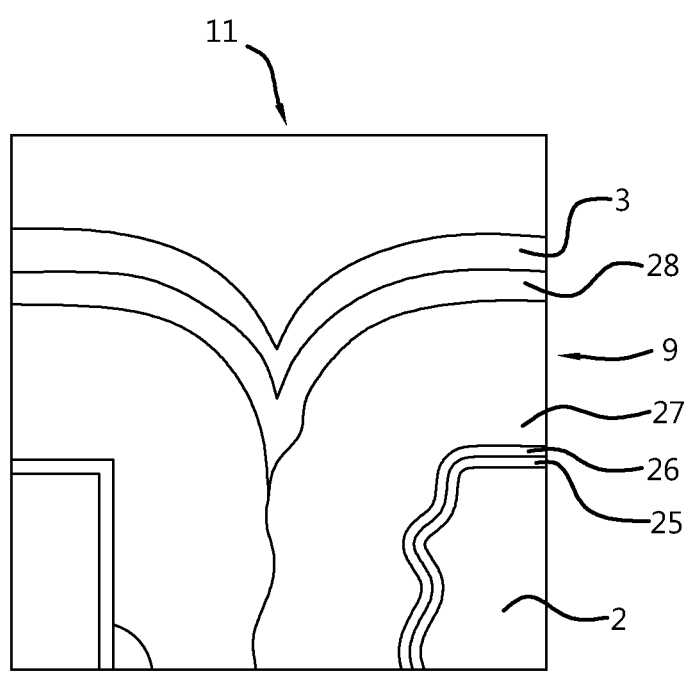
FIG. 3 furthermore schematically shows a layer stack in the channel wall.

FIG. 3 shows the top of an etch-trench which has been closed with a wall-forming layer 9 comprising such a layer stack. From bottom to top, FIG. 3 shows the t-$SiO_2$ and SiRN layers 25, 26 of 1 μm thick, the 5 μm poly-silicon layer 27, the second SiRN layer 28 of 1 μm and finally a photoresist layer 3 on top.

In this case, the trench was only 10 μm wide, and it was completely closed during deposition of the polySi layer 27. As a result, the final SiRN layer 28 is only to be found on top of the wafer 2 and not at the inside of the channel wall 7.

Silicon Isotropic Wet Etching

Silicon isotropic wet etching, also known as HNA etching, is a chemical etching of silicon by a mixture of hydrofluoric acid (H), nitric acid (N) and acetic acid (A), while some researchers like to use water instead of acetic acid. It is proceeded by a sequential oxidation-followed-by-dissolution process. The complete reaction can be described as:

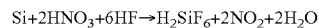

$$Si+2HNO_3+6HF \rightarrow H_2SiF_6+2NO_2+2H_2O$$

The factor that limits the etch rate is highly dependent on the composition of the mixture. When the concentration of nitric acid is low and hydrofluoric acid is high, the etch rate of process is limited by the oxidation step. When in the opposite situation, the limit is then the dissolution of $SiO_2$.

With a sufficient supply of etchant, together with an ultrasonic bath to accelerate diffusion of etchant and etching product, the maximum diameter of etched channels 1 will be limited only by the depth of trench 15 and thickness of SiRN mask. From the earlier test, SiRN is a good material to serve as a mask for HNA solution, with an etch rate of approximately 23 nm per minute. However, a thicker layer of SiRN can stand longer during etching, as a trade-off, it also becomes more difficult to remove the layer at the bottom 16 of trenches 15. Thus an alternate material can also be considered to serve as mask for HNA solution.

Channel Release

Releasing the channels 1 "from the bulk" is done in three steps. First, the channel wall 7 layer stack 9, which is also deposited on the top/front side 11 of the wafer may be patterned with release windows next to the channels 1 using a directional plasma etch. To prevent the exposed polySi layer 27 from etching during the bulk etch, a new photoresist layer 3 is applied with smaller release windows. This photoresist requires excellent planarization properties to be able to fully cover the 10 μm step and also allow for accurate enough patterning for comb-fingers used for capacitive read-out. Next, e.g. 200 μm deep trenches may be etched through the release windows using a directional plasma etch. To remove the silicon underneath the channel 1, an isotropic XeF$_2$ etch is done through these trenches.

Figure 4:
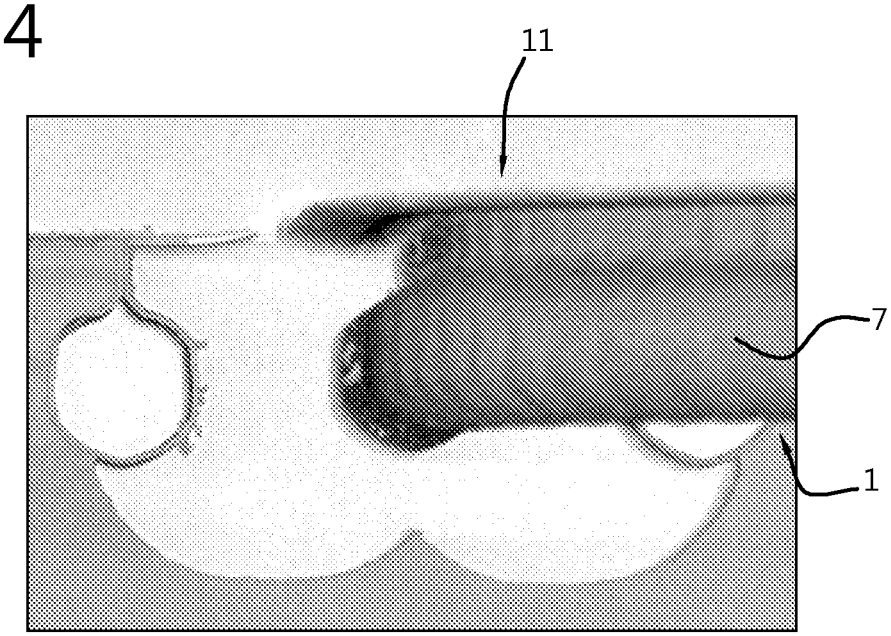
FIG. 4 schematically shows a free-hanging channel next to another partly released free-hanging channel.

To keep the silicon loading during this etch low (and thus the etch-rate relatively high), parallel channels 1 were made around the free-hanging channel 1 to act as an etch-stop. This is shown in FIG. 4. The "pillars" above the channel 1 show a periodic pattern which coincides with the e.g. 50 μm long etch-trenches with e.g. 10 μm spacing between. The channel wall 7 shows a periodic pattern with the same periodic pattern.

Actuation and Read-Out

Figure 5:
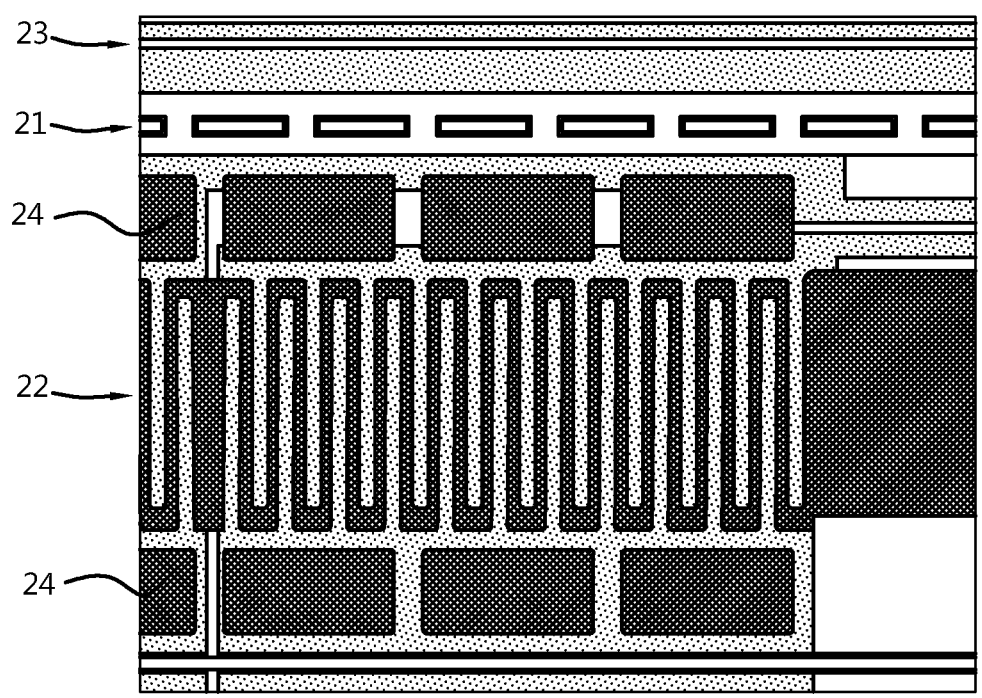
FIG. 5 schematically shows metal electrodes on a free-hanging channel.

FIG. 5 shows the metal electrodes 23 on a free-hanging channel 1, i.e. FIG. 5 shows some metal electrodes 23 on the free-hanging channel 1 at the top for actuation. Below that, the closed channel-etch-trenches 21 are still visible. In the middle of FIG. 5, comb fingers 22 for capacitive read-out are shown. One side of the comb structure 22 is attached to the free-hanging channel 1, the other side to the bulk of the chip. Since the comb fingers 22 significantly reduce the etch-rate of the release etch, extra release holes 24 are etched above and below the comb fingers 22.

Thus, the Applicant has developed a fabrication process for the fabrication of relatively large, round free-hanging microchannels 1. The channels 1 can have a diameter up e.g. to 180 μm with a channel wall 7 thickness of e.g. up to 10 μm. Integrated metal electrodes 23 can be used for actuation and read-out of e.g. a microfluidic sensor, such as a high flow micro Coriolis mass flow sensor.

Second Method

A second method that may result in (almost perfectly) circular channels 1 with various diameters and channel wall 7 thicknesses comprises a so-called "sol-gel" method.

FIGS. 6a-6f show a process outline of how this method can be used to realize channels 1 with a channel wall 7 of e.g. silicon dioxide. A sol-gel mixture may be created by e.g. mixing TEOS, MTES, ethanol and water in a 1:1:1:1 volumetric ratio, adding HCl to adjust the pH to 4.

Figure 6A:
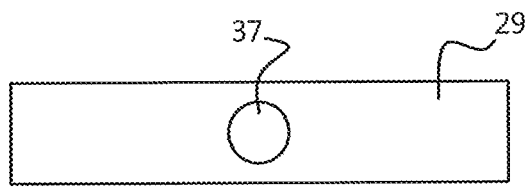
In FIGS. 6a-6f different stages of manufacturing a free-standing microchannel according to the second method are shown.
Figure 6B:
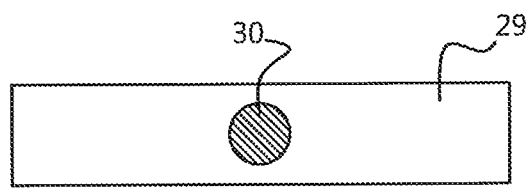
Figure 6C:
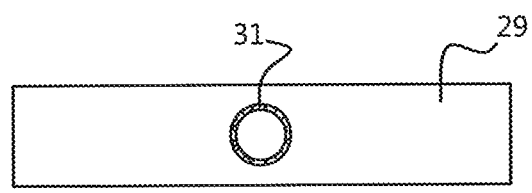

Referring to FIGS. 6a-6c, the mixture may be placed in an oven for 12 hours. A circular mould 29 is made preferably in PDMS using the ESCARGOT method. As shown in FIG. 6b, the mould 29 may then be flushed with Piranha solution 30 for e.g. 35-70 s for having hydroxyl groups 31 to form covalent bonds, and may subsequently be rinsed with DI water and dried by nitrogen flow.

Figure 6D:
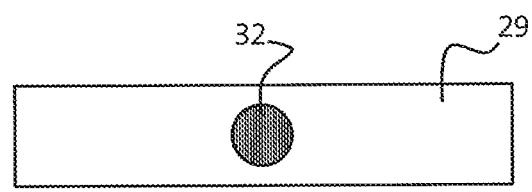

As shown in FIG. 6d, next, the sol-gel mixture 32 may be slowly flushed through the channel 37 e.g. using a syringe pump. To initiate the gelation reaction, the channel 37 is preferably placed on a hot plate at 55° C. This temperature may be limited by two factors: ethanol evaporation that leads to a non-uniform channel and the glass transition temperature of PDMS, when PDMS is used. When the desired coating thickness is reached, air flow may be used to flush out the remaining solution.

Figure 6E:
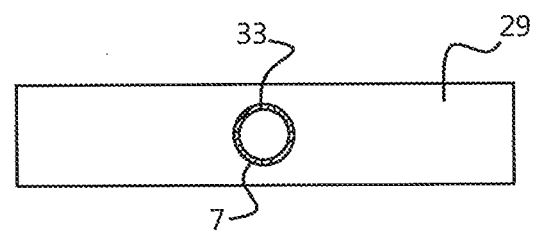
Figure 6F:
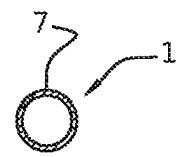

FIG. 6e shows the resulting silicon dioxide layer 33 inside the circular channel 37 with a diameter of e.g. 600 μm. A free-standing channel 1 can then be realized by selectively dissolving the PDMS of the mould 29 around the silicon dioxide layer 33. The thickness of the silicon dioxide layer 33 can be controlled e.g. by the time and temperature of the layer-forming process, and the rate of the syringe pump. However, it should be noted that the creation of the free-standing channel 1 can be challenging, because PDMS does not easily dissolve in the Piranha solution and, as the skilled person will understand, care should be taken that the silicon dioxide layer 33 does not also dissolve.

Third Method

A third method that can be used is electroplating. Plating can be performed on wires 34 (with a circular cross-section) of for instance Acrylonitrile-Butadiene-Styrene (ABS), which can afterwards be dissolved by e.g. acetone. FIGS. 7a-7d show possible process steps of this method. The copper electroplating cell may comprise a copper anode, the ABS wire 34 as cathode, an aqueous copper solution and a DC power supply (not shown). However, nickel or other metals can in principle also be used.

Figure 7A:
In FIGS. 7a-7d different stages of manufacturing a free-standing microchannel according to the third method are shown.
Figure 7B:
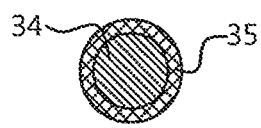
Figure 7C:
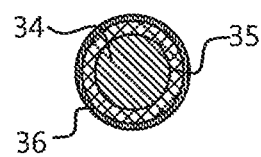
Figure 7D:
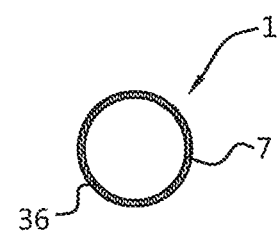

To produce an electrically conductive cathode the FDM-ABS wire 34 may be coated by silver conductive paint 35 and dried at room temperature. A volume of 1 litre aqueous copper solution preferably contains 0.1 kg copper salt, 0.11 litre 96% sulphuric acid, 0.15 ml 50% HCl, 10 ml HL11 starter and 0.25 ml HL13 grain refiner. DI water may be added to reach the required volume. The electroplating may be done e.g. at room temperature with a current density of 3 A/dm$^2$ for 1 h. After electroplating, the substrate is rinsed with DI water to prevent oxidation of the electroplated copper 36. Next, the wire 34 may be immersed in e.g. a beaker of acetone for 12 hours to completely dissolve the ABS wire 34 inside. Instead of ABS, PA or PVA polymer could also be used which can be dissolved in hot water. FIG. 7d shows a schematic depiction of the resulting free-standing channel 1.

This plating method can be used to predictably manufacture microchannels with a very high degree of circularity, e.g., the channels 1 produced by the plating method have a high degree of rotational symmetry. Flat parts can be prevented by selecting a highly circular wire 34.

The method was repeatedly tested using ABS wires 34 with a diameter of 120 to 1000 μm. Table 1 shows examples of measured wall thicknesses for several different runs of nickel electroplating for every size of ABS wire 34. The thinnest wall thickness achieved was approximately 8 μm. The thickest walls were 60 μm, and thicker walls can be achieved if the electroplating step is permitted to continue even longer.

TABLE 1

| Diameter of the ABS wire | Thickness of the nickel coating (wall thickness) |
|---|---|
| 120 μm | 8 μm, 20 μm, 40 μm |
| 128 μm-130 μm | 8 μm, 10 μm, 20 μm, 40 μm, 50 μm, 60 μm |
| 165 μm | 8 μm, 10 μm, 20 μm, 40 μm, 50 μm |
| 169 μm | 10 μm, 20 μm, 40 μm, 50 μm, 60 μm |
| 178 μm | 10 μm, 20 μm, 30 μm, |
| 233 μm | 10 μm 20 μm, 30 μm, 43 μm |
| 550 μm | 10 μm, 20 μm, 40 μm, 50 μm, 60 μm |
| 600 μm | 10 μm, 20 μm, 40 μm, 50 μm, 60 μm |
| 862 μm | 10 μm, 15 μm, 20 μm, 30 μm, 40 μm, and 50 μm |
| 866 μm | 10 μm, 15 μm, 20 μm, 30 μm, 40 μm, and 50 μm |
| 1000 μm | 9 μm, 10 μm, 15 μm, 20 μm, 30 μm, 40 μm, and 50 μm |

Thus the method can be used to manufacture channels with ratio of wall thickness to channel diameter from approximately 1:3 to 1:115. In addition, the channel walls were found to be highly uniform.

The plating method can be used to manufacture a microfluidic density sensor with low fabrication cost. Such a density sensor could preferably comprise a free-standing U-shaped channel, where the straight leg parts are connected to the straight middle part by rounded edges. In this case, the density sensor tube is made of nickel.

The channel is made using electroplating. Before immersion in the bath, a 600 µm diameter ABS wire is bent into the U-shape (optionally using a mould), deep coated with silver paint and dried. The anode of the electroplating cell is a 99.99% pure nickel bar, whereas the conductive or non-conductive electroplating wire forms the cathode. The electroplating is allowed to continue until the desired wall thickness of 20 µm was reached. Then the wire was removed from the electroplating bath and placed in an ABS-dissolving liquid consisting of acetone, and optionally heated. The resulting channel has a highly circular cross-section with a diameter of 600 µm and a wall thickness of 20 µm.

The U-shaped density sensor channel is 12*12 mm long and broad, and may be used in a set-up similar to those mentioned in aforementioned Groenesteijn, et al., 2012. The density sensor was further assembled by placing three external magnets parallel to the length of the channel, attaching the power supply and connecting the inlet to a fluid supply and the outlet to a drain. Preferably, a filter and a degasser are placed before the inlet. Alternating current is applied to the density sensor tube in the presence of an external magnetic field to vibrate the channel by Lorentz force. When the vibrating channel fills with fluid, the mass increases and this increase can be detected through change in (twist mode) resonance frequency. The mode of detection can change depending on the channel shape used. This density sensor has a spring constant of $1.56*10^4$ N/m and a of $3.78*10^5$ at atmospheric pressure and room temperature. The circular cross-section of the channel results in low dependency on gauge pressure.

LIST OF REFERENCE NUMERALS

1. Microchannel
2. Substrate of first material (silicon)
3. Photoresist layer
4. First thermal $SiO_2$ layer
5. LPCVD $SiO_2$ layer
6. PECVD $SiO_2$ layer
7. Channel wall
8. Metal layer
9. Wall-forming layer
10. Inlet
11. Front side
12. Back side
13. Inlet side wall
14. Inlet top wall
15. Trench
16. Trench bottom wall
17. Trench side wall
18. Second thermal $SiO_2$ layer
19. Channel outline
20. Continuous flow channel
21. Closed channel etch-trench
22. Comb structure with comb fingers
23. Metal electrodes
24. Release hole
25. First wall-forming layer (thermal $SiO_2$)
26. Second wall-forming layer (SiRN)
27. Third wall-forming layer (polySi)
28. Fourth wall-forming layer (SiRN)
29. Circular mould
30. Piranha solution
31. Hydroxyl group
32. Sol-gel mixture
33. Silicon dioxide layer
34. ABS wire
35. Silver layer
36. Copper layer
37. Circular channel of mould

The invention claimed is:

1. A microelectromechanical system component or microfluidic component comprising a free-hanging or free-standing, non-permeable microchannel, wherein the microchannel has a substantially circular cross-section, wherein the diameter of the microchannel is at least 10 times the thickness of the microchannel wall and the diameter of the microchannel is at least 20 µm.

2. The microelectromechanical system component or microfluidic component according to claim 1, wherein the diameter of the microchannel is selected from at least 50 µm, at least 100 µm, at least 200 µm, at least 500 µm, and at least 1000 µm.

3. The microelectromechanical system component or microfluidic component according to claim 1, wherein the thickness of the microchannel wall is smaller than 10 µm.

4. A flow sensor comprising the microelectromechanical system component or microfluidic component according to claim 1.

5. The flow sensor according to claim 4, wherein the flow sensor is at least one of a thermal flow sensor, a Coriolis flow sensor, a pressure sensor, a density sensor, a viscosity sensor, a multi-parameter sensor, a valve, a pump and a microheater.

6. The microelectromechanical system component or microfluidic component according to claim 1, wherein the free-hanging or free-standing microchannel is manufactured using a sol-gel method comprising the steps of:
    forming a mould with a circular channel;
    flushing the circular channel with a flushing fluid to create an oxidized inner channel wall;
    cleaning and drying the oxidized inner channel wall;
    flushing the circular channel with a sol-gel solution;
    initiating a gelation reaction until a desired microchannel wall thickness is achieved;
    flushing out the remaining sol-gel solution; and
    removing the mould material from around the microchannel wall.

7. A method of manufacturing a non-permeable free-hanging or free-standing microchannel using an electroplating method comprising the steps of:
    manufacturing a non-permeable free-hanging or free-standing microchannel by:
    providing a conductive or non-conductive electroplating wire;
    when the electroplating wire is non-conductive: forming a conductive coating on the electroplating wire to form a cathode;
    electroplating a channel wall on the electroplating wire or the conductive coating; and
    removing the electroplating wire, thereby obtaining a free-hanging or free-standing, non-permeable microchannel.

8. The method according to claim 7, wherein the microchannel has a substantially circular cross-section, wherein the diameter of the microchannel is at least 10 times the thickness of the microchannel wall and the diameter of the microchannel is at least 20 µm.

9. The method according to claim 7, wherein the electroplating wire is made of acrylonitrile-butadiene-styrene (ABS) or copper.

10. The method according to claim 7, wherein the conductive coating comprises silver.

11. The method according to claim 7, wherein the microchannel wall comprises nickel or copper and the electroplating step is carried out in a nickel or copper electroplating cell using an aqueous nickel or copper solution.

12. The method according to claim 7, wherein after the step of removing the electroplating wire, thereby obtaining a free-hanging or free-standing, non-permeable microchannel, the method comprises the further step of incorporating the microchannel in a microelectromechanical system (MEMS) component or a microfluidic system.

13. The method according to claim 7, wherein the electroplating wire is provided pre-shaped, having one or more bends, so as to manufacture a free-standing microchannel in that shape without bending the microchannel, to be a part of a MEMS system or a microfluidic system before the step of electroplating.

14. The method according to claim 13, wherein the pre-shaped electroplating wire is provided attached to a MEMS system or a microfluidic system before the step of electroplating.

15. A free-hanging or free-standing microchannel manufactured according to the method of claim 7.

16. A microfluidic system or a MEMS system, comprising the free-hanging or free-standing microchannel of claim 5.

17. A flow sensor, comprising the free-hanging or free-standing microchannel according to claim 15.

18. The flow sensor according to claim 17, wherein the flow sensor is at least one of a thermal flow sensor, a Coriolis flow sensor, a pressure sensor, a density sensor, a viscosity sensor, a multi-parameter sensor, a valve, a pump and a microheater.

19. A microfluidic density sensor comprising:
a free-hanging or free-standing, non-permeable microchannel manufactured using an electroplating method comprising the steps of:
manufacturing a free-hanging or free-standing, non-permeable microchannel by:
providing a conductive or non-conductive electroplating wire;
when the electroplating wire is non-conductive: forming a conductive coating on the electroplating wire to form a cathode;
electroplating a channel wall on the electroplating wire or the conductive coating; and
removing the electroplating wire, thereby obtaining a free-hanging or free-standing, non-permeable microchannel;
actuating means for vibrating the free-hanging or free-standing microchannel at its resonance frequency; and
readout means for measuring and comparing the resonance frequency.

20. A method of manufacturing a free-hanging microchannel, comprising the steps of:
(a) providing a substrate of a first material;
(b) depositing a trench-etch protective layer on at least one of a front side and a back side of the substrate;
(c) etching a trench in the first material through the trench-etch protective layer;
(d) creating a channel-etch protective layer in the trench, covering a bottom wall and side walls of the trench;
(e) etching the first material of the substrate through the channel-etch protective layer and the bottom wall of the trench to form a channel outline centering around the location of the etched-away bottom wall of the trench;
(f) removing the trench-etch and channel-etch protective layers from the substrate;
(g) depositing a wall-forming layer on the substrate, wherein the wall-forming layer forms a microchannel wall on the channel outline and closes the trench;
(h) etching the substrate to remove the first material surrounding the microchannel wall, such that the microchannel becomes free-hanging.

21. The method according to claim 20, wherein the microchannel has a substantially circular cross-section, wherein the diameter of the microchannel is at least 10 times the thickness of the microchannel wall and the diameter of the microchannel is at least 20 μm.

* * * * *